United States Patent
Chen et al.

(10) Patent No.: US 10,325,453 B2
(45) Date of Patent: Jun. 18, 2019

(54) DOORBELL DEVICE AND ASSOCIATED CONTROL METHOD

(71) Applicant: Sercomm Corporation, Taipei (TW)

(72) Inventors: Chien-Ming Chen, Taipei (TW); Meng-Chien Chiang, Taipei (TW)

(73) Assignee: SERCOMM CORPORATION, Taipei (TW)

(*) Notice: Subject to any disclaimer, the term of this patent is extended or adjusted under 35 U.S.C. 154(b) by 0 days.

(21) Appl. No.: 15/933,509

(22) Filed: Mar. 23, 2018

(65) Prior Publication Data
US 2018/0322743 A1    Nov. 8, 2018

(30) Foreign Application Priority Data
May 8, 2017 (CN) ............. 2017 1 0317313

(51) Int. Cl.
*G08B 3/10* (2006.01)
*G01K 7/02* (2006.01)
*H02J 7/00* (2006.01)
*H02J 7/02* (2016.01)
*H04M 1/02* (2006.01)
*H04M 11/02* (2006.01)
*G01R 19/165* (2006.01)

(52) U.S. Cl.
CPC .............. *G08B 3/10* (2013.01); *G01K 7/021* (2013.01); *G01R 19/16571* (2013.01); *H02J 7/007* (2013.01); *H02J 7/02* (2013.01); *H04M 1/0291* (2013.01); *H04M 11/025* (2013.01)

(58) Field of Classification Search
CPC .... G08B 3/10; G01K 7/021; G01R 19/16571; H02J 7/007; H04M 1/0291; H04M 1/025
USPC ............................. 340/286.11, 384.1
See application file for complete search history.

(56) References Cited

U.S. PATENT DOCUMENTS

| | | | |
|---|---|---|---|
| 7,990,281 B2* | 8/2011 | Tylicki | G10K 1/26 340/384.1 |
| 9,055,202 B1 | 6/2015 | Scalisi et al. | |
| 9,172,920 B1* | 10/2015 | Kasmir | H04M 1/0291 |
| 9,172,921 B1 | 10/2015 | Scalisi et al. | |
| 9,253,455 B1 | 2/2016 | Harrison et al. | |
| 9,633,530 B2* | 4/2017 | Chen | G10K 1/064 |
| 9,761,092 B2* | 9/2017 | Chen | H02J 3/12 |
| 9,799,182 B1* | 10/2017 | Modi | G08B 13/19691 |

(Continued)

FOREIGN PATENT DOCUMENTS

| | | |
|---|---|---|
| CN | 105228412 A | 1/2016 |
| CN | 205354223 U | 6/2016 |

*Primary Examiner* — Eric Blount
(74) *Attorney, Agent, or Firm* — McClure, Qualey & Rodack, LLP

(57) ABSTRACT

A doorbell device has a first power input terminal and a second power input terminal. The doorbell device is coupled to a chime device. The doorbell device includes a current sensing circuit, a switch circuit, and a processing circuit. The current sensing circuit is coupled to the first power input terminal, and generates a sensing voltage according to a current flowing through the current sensing circuit. The switch circuit is coupled between the current sensing circuit and the second power input terminal. The switch circuit changes the conducting state in response to a control signal. The processing circuit is configured to provide the control signal and determine the type of the chime device according to the sensing voltage.

6 Claims, 6 Drawing Sheets

(56) References Cited

U.S. PATENT DOCUMENTS

| | | |
|---|---|---|
| 2015/0029008 A1 | 1/2015 | Scalisi et al. |
| 2015/0029009 A1 | 1/2015 | Scalisi et al. |
| 2015/0029334 A1 | 1/2015 | Scalisi |
| 2015/0029335 A1 | 1/2015 | Kasmir et al. |
| 2015/0049191 A1 | 2/2015 | Scalisi et al. |
| 2015/0054949 A1 | 2/2015 | Scalisi |
| 2015/0070495 A1 | 3/2015 | Scalisi |
| 2015/0092055 A1 | 4/2015 | Scalisi et al. |
| 2015/0109113 A1 | 4/2015 | Scalisi et al. |
| 2015/0116490 A1 | 4/2015 | Scalisi |
| 2015/0145993 A1 | 5/2015 | Scalisi |
| 2015/0161856 A1* | 6/2015 | Wilson .................... G08B 3/10 340/392.1 |
| 2015/0228167 A1 | 8/2015 | Scalisi et al. |
| 2015/0319411 A1 | 11/2015 | Kasmir et al. |
| 2015/0341603 A1 | 11/2015 | Kasmir et al. |
| 2015/0371469 A1 | 12/2015 | Scalisi |
| 2016/0044287 A1 | 2/2016 | Scalisi et al. |
| 2016/0134826 A1 | 5/2016 | Scalisi |
| 2016/0258202 A1 | 9/2016 | Scalisi |
| 2016/0261824 A1 | 9/2016 | Scalisi |
| 2016/0275739 A1 | 9/2016 | Scalisi |
| 2016/0284170 A1 | 9/2016 | Kasmir et al. |
| 2016/0300476 A1 | 10/2016 | Kasmir et al. |
| 2016/0330412 A1 | 11/2016 | Scalisi et al. |
| 2016/0330413 A1 | 11/2016 | Scalisi et al. |
| 2017/0032637 A1 | 2/2017 | Harrison et al. |
| 2017/0034485 A1 | 2/2017 | Scalisi |
| 2017/0048495 A1* | 2/2017 | Scalisi ................ H04L 12/2818 |
| 2017/0084131 A1 | 3/2017 | Harrison et al. |
| 2017/0084132 A1 | 3/2017 | Scalisi |
| 2017/0085843 A1 | 3/2017 | Scalisi et al. |
| 2017/0085844 A1 | 3/2017 | Scalisi et al. |

\* cited by examiner

DOORBELL DEVICE AND ASSOCIATED CONTROL METHOD

CROSS-REFERENCE TO RELATED APPLICATION

This application claims the benefit of People's Republic of China application Serial No. 201710317313.3, filed on May 8, 2017, the subject matter of which is incorporated herein by reference.

TECHNICAL FIELD

The disclosure relates in general to a doorbell device and associated control method, and more particularly to a doorbell device capable of determining the type of the chime device.

BACKGROUND

Doorbell has been widely used in most families at the door entrance. The doorbell located outdoors may be pressed when a visitor arrives, such that a chime device located indoors may generate sound. The chime device has several different types, for example, some may produce sound by metal collision, while some may play melody through a speaker. The installation of the doorbell device often requires manual setting and adjustment corresponding to the various types of chime devices. Therefore it is an important subject in the industry to design a doorbell device that can determine the type of the chime device automatically.

SUMMARY

One of the purposes of this invention is to provide a doorbell device and associated control method that can determine the type of the chime device. The invention can also be applied to a doorbell device having a heating function or a charging function.

According to one embodiment, a doorbell device is provided. The doorbell device has a first power input terminal and a second power input terminal. The doorbell device is coupled to a chime device. The doorbell device includes a current sensing circuit, a switch circuit, and a processing circuit. The current sensing circuit is coupled to the first power input terminal, and generates a sensing voltage according to a current flowing through the current sensing circuit. The switch circuit is coupled between the current sensing circuit and the second power input terminal. The switch circuit changes the conducting state in response to a control signal. The processing circuit is configured to provide the control signal and determine the type of the chime device according to the sensing voltage.

According to another embodiment, a control method for a doorbell device is provided. The doorbell device is coupled to a chime device, and the doorbell device includes a switch circuit and a current sensing circuit. The control method includes the following steps. Provide a control signal to control a conducting state of the switch circuit, wherein the switch circuit is coupled to the current sensing circuit, and the current sensing circuit generates a sensing voltage according to a current flowing through the current sensing circuit. Determine the type of the chime device according to the sensing voltage.

Figure 1:
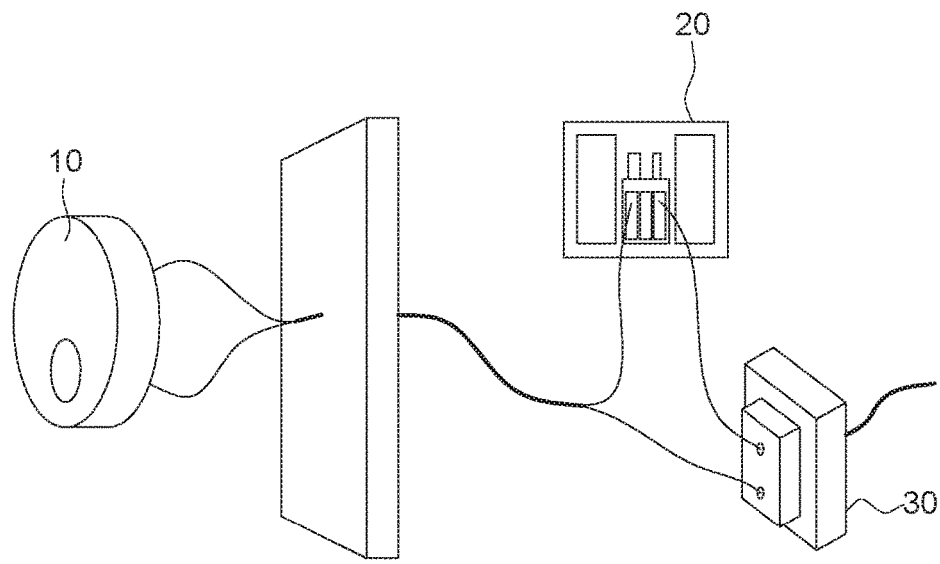
FIG. 1 shows a doorbell device connected with a chime device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows a doorbell device connected with a chime device. The left of FIG. 1 represents outdoors and the right represents indoors. The main power grid (such as AC 100V~240V) supplied to the building is connected to a transformer 30, and then converted into a lower voltage AC signal (such as AC 8V~36V) through the transformer 30. The transformer 30 is connected to a chime device 20 and a doorbell device 10 located outdoors. When someone presses a button on the doorbell device 10, the current through the chime device 20 may change or a specific control signal may be sent to the chime device 20, such that the chime device 20 produces sound. The chime device 20 illustrated in FIG. 1 is for example an analog chime device (such as including a metal solenoid). In other embodiments, the chime device 20 may be a digital chime device (such as including a melody integrated circuit and a speaker).

It is usually necessary to verify the type of the chime device 20 when the doorbell device 10 is installed, so that the doorbell device 10 can be correctly setup. For example, the user can set the type of the chime device 20 through a mobile phone application or a webpage user interface to prevent the doorbell device 10 from causing the malfunction of the chime device 20. In order to know the type of the chime device 20, the installation personnel needs to hear the sound from the chime device 20 and determine the type of the chime device 20 in a subjective manner, which may result in a judgment error. Moreover, the location where the chime device 20 is installed may be far from the doorbell device 10, making it difficult for the installation personnel to hear the sound produced by the chime device 20.

A doorbell device 10 capable of automatically determining the type of the chime device 20 is provided in this disclosure, making the installation process of the doorbell device 10 easier. Several embodiments will be given below to describe the doorbell device and the control method for the doorbell device of the present invention.

Figure 2:
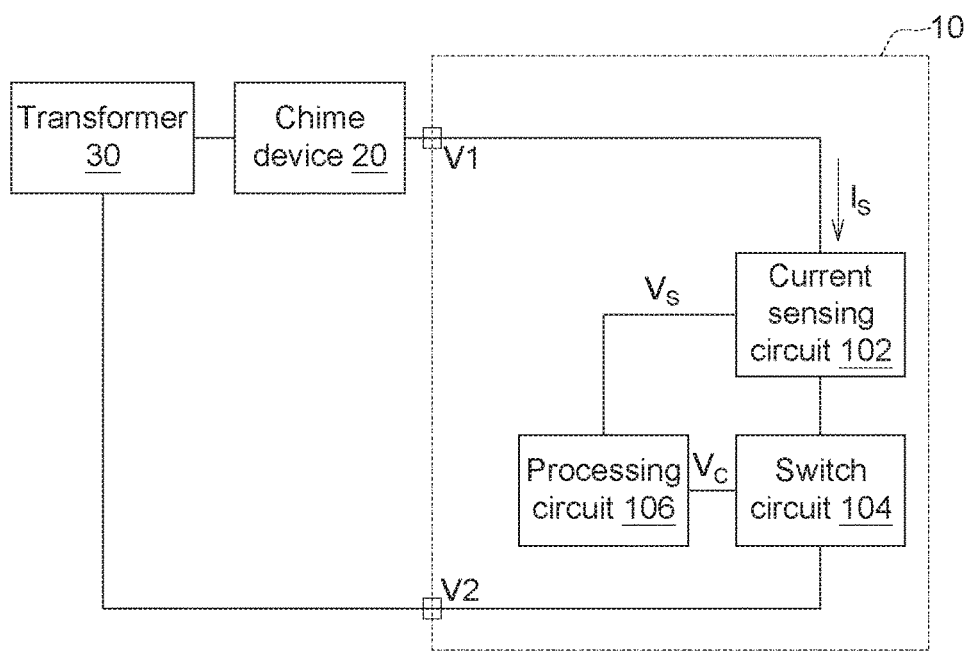
FIG. 2 shows a doorbell device according to an embodiment of the invention.

FIG. 2 shows a doorbell device according to an embodiment of the invention. The doorbell device 10 has a first power input terminal V1 and a second power input terminal V2. The doorbell device 10 is coupled to a chime device 20. The doorbell device 10 includes a current sensing circuit 102, a switch circuit 104, and a processing circuit 106. The switch circuit 104 is coupled between the current sensing circuit 102 and the second power input terminal V2. The switch circuit 104 changes the conducting state in response to a control signal $V_C$. The processing circuit 106 is configured to provide the control signal $V_C$ to turn on the switch circuit 104 when determining the type of the chime device 20. In this case the current sensing circuit 102 is coupled to the first power input terminal V1 and the second power input terminal V2 (when the switch circuit 104 is on), and the current sensing circuit 102 generates a sensing voltage $V_S$ according to the current $I_S$ flowing through the current sensing circuit 102. The processing circuit 106 is configured to determine the type of the chime device 20 according to the sensing voltage $V_S$.

The transformer 30 may be connected to the main power grid, and the chime device 20 may be connected to the transformer 30. The first power input terminal V1 and the second power input terminal V2 of the doorbell device 10 receive the power signal (such as AC 24V) provided by the transformer 30 to supply power to the doorbell device 10.

The current sensing circuit 102 may use a Hall-effect current sensor, a current sensor integrated circuit (IC), or other circuitry that can output a sensing voltage in response to the sensed current. The current sensing circuit 102 may sense the current $I_S$ flowing through the current sensing circuit 102 to generate a corresponding sensing voltage $V_S$. The sensing voltage $V_S$ is for example positively correlated with the current $I_S$.

The switch circuit 104 may use a relay or other electronic switches (such as including transistors). The switch circuit 104 may switch the conducting state in response to the control signal $V_C$. When the switch circuit 104 is off, a nearly open state exists between the current sensing circuit 102 and the second power input terminal V2, and thus the current $I_S$ is very small in this situation, which corresponds to the state when the doorbell's button is not pressed. When the switch circuit 104 is on, a conducting path is created between the current sensing circuit 102 and the second power input terminal V2, and thus a larger current $I_S$ is generated, which corresponds to the state when the doorbell's button is pressed.

The processing circuit 106 may be a microprocessor, a microcontroller, or an application specific integrated circuit capable of performing the control method of this invention. The processing circuit 106 is configured to provide the control signal $V_C$. For example, the processing circuit 106 may enable the control signal $V_C$ to turn on the switch circuit 104 when the doorbell's button is pressed, and the processing circuit 106 may disable the control signal $V_C$ to turn off the switch circuit 104 when the doorbell's button is not pressed.

For different types of the chime device 20 having different internal resistance, the current $I_S$ flowing through the current sensing circuit 102 will be different when the processing circuit 106 enables the control signal $V_C$. Different sensing voltage $V_S$ will be generated correspondingly and the processing circuit 106 may determine the type of the chime device 20 according to the sensing voltage $V_S$. As such, the doorbell device 10 can automatically determine the type of the chime device 20, such that the installation process can be simplified, preventing the doorbell device 10 from causing the malfunction of the chime device 20.

Figure 9:
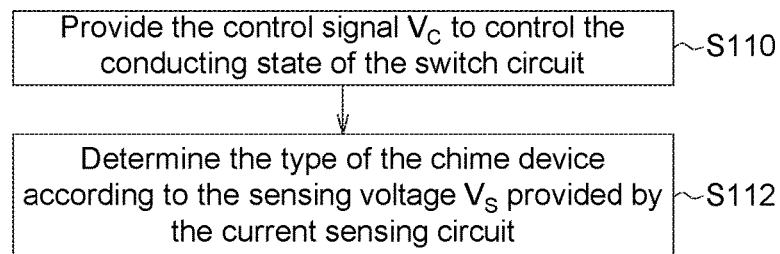
FIG. 9 shows a flowchart of a control method for a doorbell device according to an embodiment of the invention.

FIG. 9 shows a flowchart of a control method for a doorbell device according to an embodiment of the invention. The control method may be performed by the processing circuit 106, and the control method includes the following steps. Step S110: Provide the control signal $V_C$ to control the conducting state of the switch circuit 104. Step S112: Determine the type of the chime device 20 according to the sensing voltage $V_S$ provided by the current sensing circuit 102.

For example, the chime device 20 may be analog or digital. An analog chime device 20 may include a solenoid wrapped with metal coil. When the doorbell button is not pressed, the solenoid remains in a stable position. When the doorbell button is pressed, the current flows through the metal coil, the solenoid moves as a result of the induced magnetic field, and the solenoid may hit an object to produce sound. A digital chime device 20 may include a melody IC and a speaker, which may store multiple melodies and may determine the music to be played according to the user's setting. When the doorbell button is pressed, the doorbell device 10 may transmit a corresponding control signal to the chime device 20, such that the chime device 20 plays the music selected by the user.

The internal resistance of an analog chime device is approximately in the order of 10Ω, while the internal resistance of a digital chime device is approximately in the order of 100 KΩ. Chime devices of different models may have different internal resistance, and chime devices from different manufacturers may also have different internal resistance. The numbers for the internal resistance given above are merely exemplary. The characteristic of the internal resistance of a chime device is that the internal resistance of an analog chime device is less than the internal resistance of a digital chime device.

If the chime device 20 has a smaller internal resistance, the corresponding current $I_S$ will be larger, and the current sensing circuit 102 will generate a larger sensing voltage $V_S$. As such, in one embodiment, the processing circuit 106 determines the chime device 20 as digital when the processing circuit 106 determines that the sensing voltage $V_S$ is less than the threshold value $V_{TH1}$. The processing circuit 106 determines the chime device 20 as analog when the processing circuit 106 determines that the sensing voltage $V_S$ is greater than the threshold value $V_{TH1}$. Since the transformer 30 provides AC voltage, the generated current $I_S$ and the sensing voltage $V_S$ are also AC signals. The processing circuit 106 may determine whether the sensing voltage $V_S$ is less than the threshold value $V_{TH1}$ according to the amplitude or the peak-to-peak value of the sensing voltage $V_S$.

Figure 3:
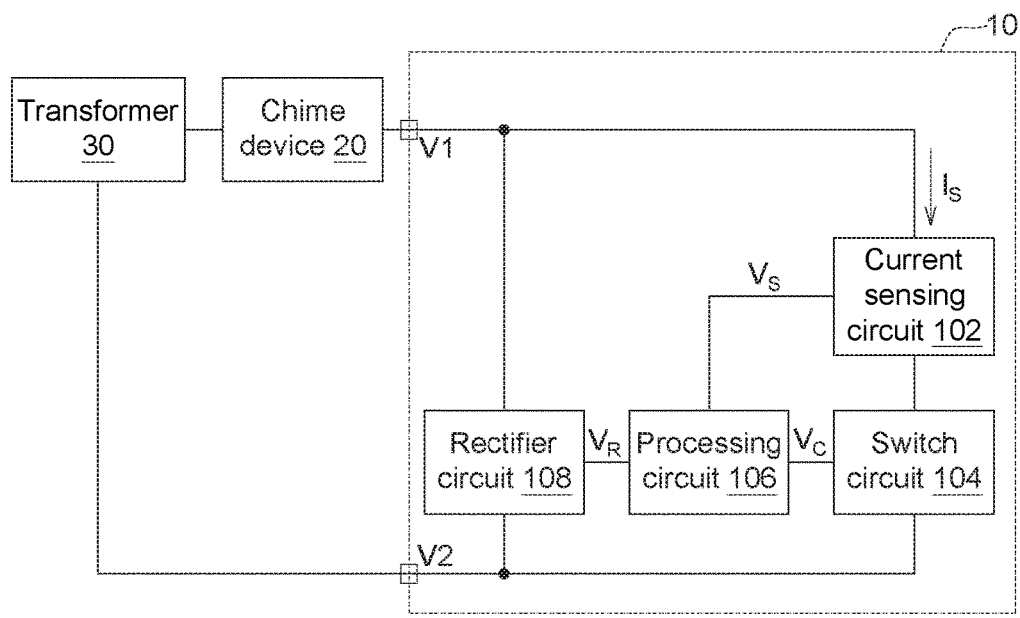
FIG. 3 shows a doorbell device including a rectifier circuit according to an embodiment of the invention.

In one embodiment, the doorbell device 10 may further include a rectifier circuit 108. FIG. 3 shows a doorbell device including a rectifier circuit according to an embodiment of the invention. The rectifier circuit 108 is coupled between the first power input terminal V1 and the second power input terminal V2. The rectifier circuit 108 provides a rectified voltage $V_R$. The processing circuit 106 may detect the rectified voltage $V_R$ to know the voltage range of the transformer 30 or whether the transformer 30 outputs a valid voltage. The processing circuit 106 may be powered by a battery during the detection described above.

Figure 4:
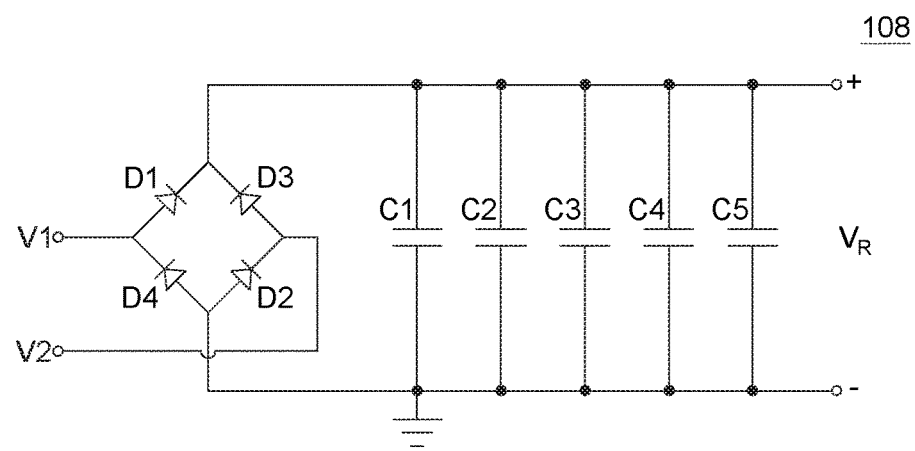
FIG. 4 shows a rectifier circuit according to an embodiment of the invention.

The rectifier circuit 108 may include a bridge rectifier or other types of half-wave rectifier or full-wave rectifier. The rectifier circuit 108 may convert an AC voltage between the first power input terminal V1 and the second power input terminal V2 to a rectified voltage $V_R$ to supply power to the doorbell device 10. FIG. 4 shows a rectifier circuit according to an embodiment of the invention. In this embodiment the rectifier circuit 108 includes a bridge rectifier consisting of four diodes D1-D4 and a voltage regulator circuit consisting of capacitors C1-C5 connected in parallel, for generating a stable rectified voltage $V_R$.

Based on the rectified voltage $V_R$, the processing circuit 106 may know the voltage supply situation and the voltage range to make suitable adjustments. In one embodiment, the processing circuit 106 enables the control signal $V_C$ to control the switch circuit 104 to be turned on when the processing circuit 106 determines that the rectified voltage $V_R$ meets a predetermined voltage condition.

For example, when the doorbell device 10 is connected to the chime device 20, the processing circuit 106 may first determine whether the rectified voltage $V_R$ meets the predetermined voltage condition to confirm whether the power supply is normal at this moment. The predetermined voltage condition is greater than a predetermined voltage, such as 6V. If the rectified voltage $V_R$ does not meet the predetermined voltage condition, such as being less than 6V, it is possible that the indoor main power switch is in the off state or currently suffers from power outage, causing the transformer 30 fail to provide voltage normally. After the processing circuit 106 determines that the rectified voltage $V_R$ meets the predetermined voltage condition, the control signal $V_C$ is enabled, and the type of the chime device 20 is determined according to the approach described above.

Different transformers 30 may produce different voltage range, such that the current $I_S$ flowing through the current sensing circuit 102 will be different as well. As such, in one embodiment, the processing circuit 106 may obtain the voltage range generated by the transformer 30 from the rectified voltage $V_R$, and then set the threshold value $V_{TH1}$ according to the rectified voltage $V_R$. The threshold value $V_{TH1}$ set by the processing circuit 106 is positively correlated with the rectified voltage $V_R$.

For example, the voltage provided by the transformer 30 is AC 16V. Based on the rectified voltage $V_R$, the processing circuit 106 may set the threshold value $V_{TH1}$ corresponding to AC 16V as 250 mV. When the sensing voltage $V_S$ is less than 250 mV (for example, the peak-to-peak value of the sensing voltage $V_S$ is 100 mV), the chime device is determined as digital. When the sensing voltage $V_S$ is greater than 250 mV (for example, the peak-to-peak value of the sensing voltage $V_S$ is 350 mV), the chime device is determined as analog.

Figure 10:
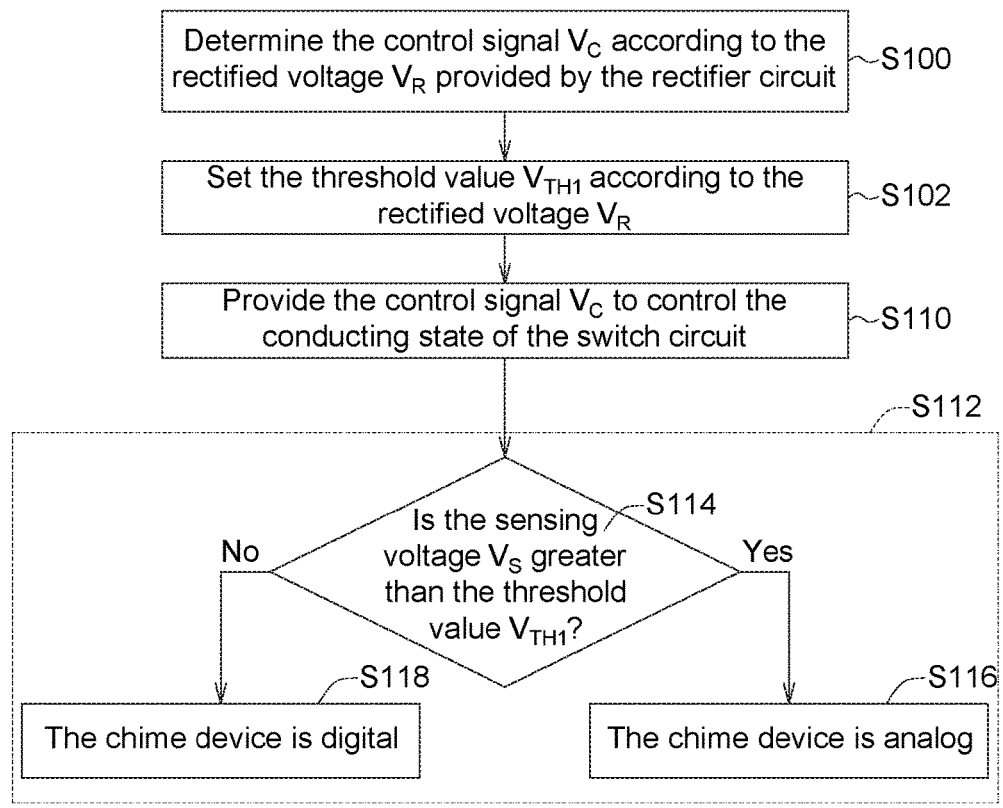
FIG. 10 shows a flowchart of a control method for a doorbell device according to an embodiment of the invention.

FIG. 10 shows a flowchart of a control method for a doorbell device according to an embodiment of the invention. The control method may be performed by the processing circuit 106. The control method includes the following steps. Step S100: Determine the control signal $V_C$ according to the rectified voltage $V_R$ provided by the rectifier circuit 108. For example, enabling the control signal $V_C$ to control the switch circuit 104 to be turned on when the rectified voltage $V_R$ meets the predetermined voltage condition. Step S102: Set the threshold value $V_{TH1}$ according to the rectified voltage $V_R$. The threshold value $V_{TH1}$ is correlated with rectified voltage $V_R$. Step S110: Provide the control signal $V_C$ to control the conducting state of the switch circuit 104. Step S114: Determine whether the sensing voltage $V_S$ is greater than the threshold value $V_{TH1}$. If yes, the chime device 20 is determined as analog in step S116. If not, the chime device 20 is determined as digital in step S118. The steps S114, S116, S118 may be corresponding to the step S112 shown in FIG. 9.

Figure 5:
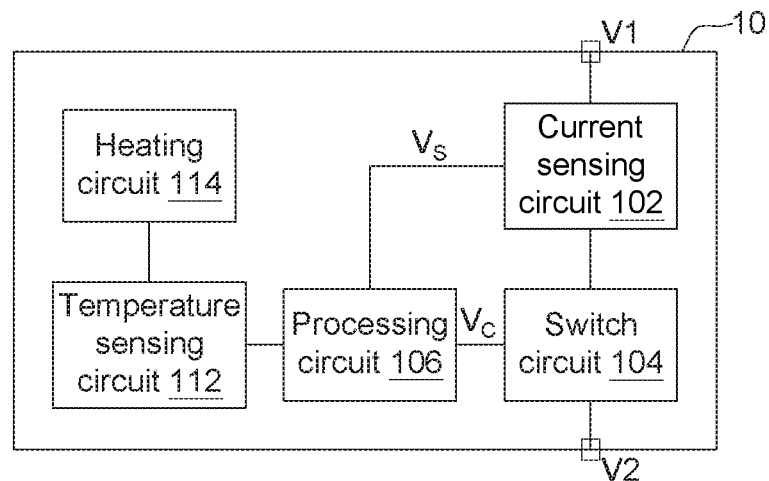
FIG. 5 shows a doorbell device including a heating circuit according to an embodiment of the invention.

FIG. 5 shows a doorbell device including a heating circuit according to an embodiment of the invention. The doorbell device 10 further includes a temperature sensing circuit 112 and a heating circuit 114. The temperature sensing circuit 112 may obtain a sensed temperature $T_S$, and control the heating circuit 114 according to the sensed temperature $T_S$. For example, the temperature sensing circuit 112 may turn on the heating circuit 114 when the sensed temperature $T_S$ is lower than a threshold. The doorbell device 10 is suitable for a cold area. The heating circuit 114 can keep the doorbell device 10 operating in a proper temperature range to ensure the normal operation of the electronic components and also provide better user experience. For example, the cold weather will not prevent the doorbell device 10 from charging its internal battery.

Although the processing circuit 106, the temperature sensing circuit 112 and the heating circuit 114 are shown in separate blocks in FIG. 5 to clearly illustrate the functional blocks in the doorbell device, in practice these blocks may also be integrated in the same circuit. For example, a microprocessor with a built-in temperature sensor may be used to integrate the processing circuit 106 and the temperature sensing circuit 112 into a single circuit. The processing circuit 106 may control the heating circuit 114 directly according to the sensed temperature $T_S$. In another embodiment, the temperature sensing circuit 112 and the heating circuit 114 may be integrated into a single circuit.

Figure 6:
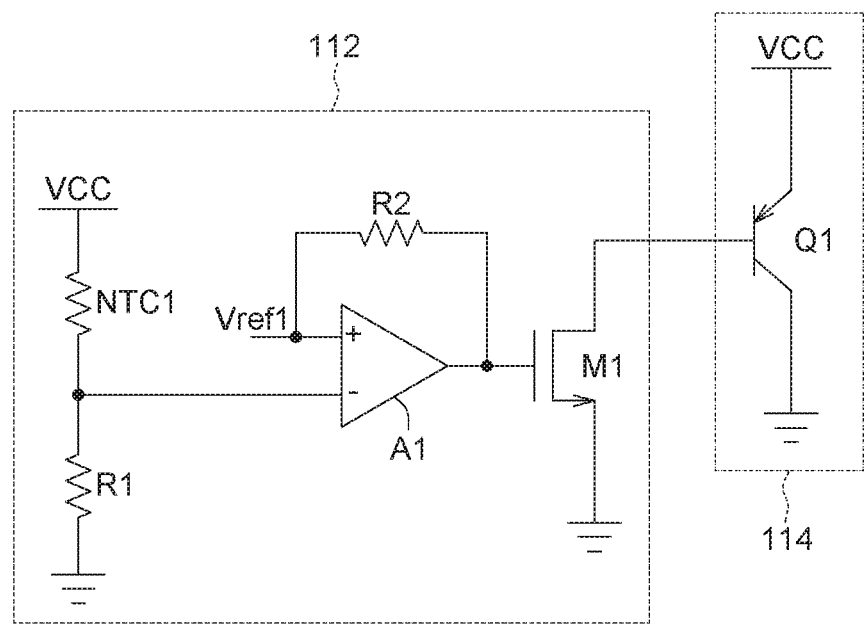
FIG. 6 shows a temperature sensing circuit and a heating circuit according to an embodiment of the invention.

In one embodiment, the temperature sensing circuit 112 may include a negative temperature coefficient (NTC) thermistor, which changes its resistance with the temperature. FIG. 6 shows a temperature sensing circuit and a heating circuit according to an embodiment of the invention. In this example the heating circuit 114 includes a PNP bipolar junction transistor (BJT) Q1, which generates heat energy when being turned on. Using the BJT as the heating element can reduce production cost as well as hardware area. The temperature sensing circuit 112 includes a thermistor NTC1, a resistor R1, a resistor R2, a comparator A1, and an NMOS transistor M1. When the ambient temperature decreases, the resistance of the thermistor NTC1 increases so that the voltage at the negative input terminal of the comparator A1 is less than the reference voltage Vref1 at the positive input terminal. The comparator A1 outputs a high voltage to turn on the NMOS transistor M1 and pull down the voltage at the base of the PNP BJT Q1. The PNP BJT Q1 is then turned on, making the PNP BJT Q1 start to generate heat and raise the temperature of the doorbell device 10.

If the chime device 20 is digital, the internal resistance of the chime device 20 is larger, and the energy that can be provided to the doorbell device 10 is less, and hence activating the heating circuit 114 might be less suitable. On the other hand, if the chime device 20 is analog, the internal resistance of the chime device 20 is smaller, and the energy that can be provided to the doorbell device 10 is larger, and hence it is suitable for activating the heating circuit 114. As such, in an embodiment, when the processing circuit 106 determines that the chime device 20 is analog and the sensed temperature $T_S$ is lower than the first threshold temperature T1 (e.g., 5° C.), the processing circuit 106 may control the temperature sensing circuit 112 to turn on the heating circuit 114.

In one embodiment, the temperature sensing circuit 112 turns off the heating circuit 114 when the sensed temperature $T_S$ is higher than a second threshold temperature T2 (e.g. 20°

C.). In this case, the temperature of the doorbell device 10 is high enough that the heating can be stopped. Referring to the example shown in FIG. 6, the resistance of the thermistor NTC1 slowly decreases as the temperature of the conducting PNP BJT Q1 gradually increases, so that the voltage at the negative input terminal of the comparator A1 becomes larger. When the voltage at the negative input terminal of the comparator A1 is larger than the reference voltage Vref1 at the positive input terminal, the comparator A1 outputs a low voltage to turn off the PNP BJT Q1 to stop heating.

Figure 7:
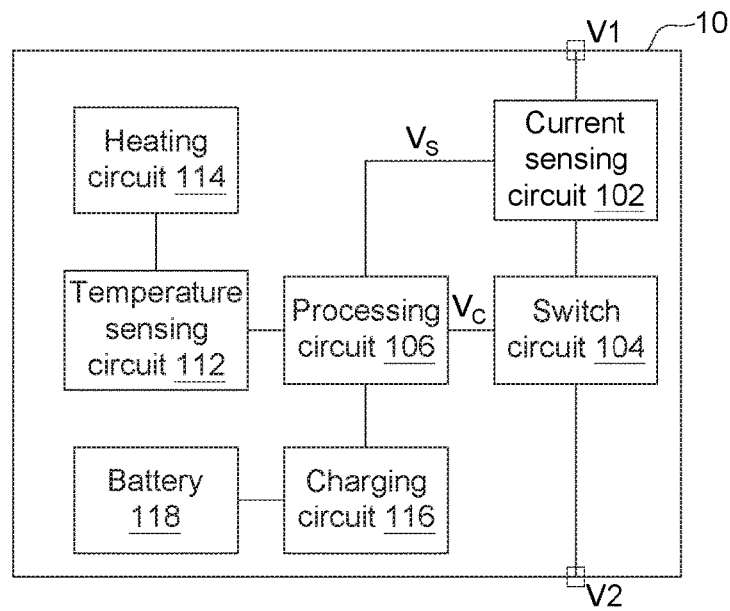
FIG. 7 shows a doorbell device including a charging circuit according to an embodiment of the invention.

FIG. 7 shows a doorbell device including a charging circuit according to an embodiment of the invention. In this embodiment, the doorbell device 10 further includes a charging circuit 116 and a battery 118. The charging circuit 116 is controlled by the processing circuit 106 to provide a charging current to the battery 118. Because the heating circuit 114 and the charging circuit 116 in the doorbell device 10 consume energy, the processing circuit 106 should appropriately control whether the heating circuit 114 is activated and whether the charging current of the charging circuit 116 is adjusted, so as to prevent abnormal operation problems caused by overloading. Examples of the abnormal operations include excitation effect in an analog chime device, and system reset or malfunction in a digital chime device.

As described above, the energy that can be provided to the doorbell device 10 is larger if the chime device 20 is analog. When the heating circuit 114 and the charging circuit 116 are both turned on, the current of the charging circuit 116 can be reduced to avoid overloading. For example, the processing circuit 106 may adjust the charging current of the charging circuit 116 according to the activated state of the heating circuit 114, such as controlling the charging circuit 116 to provide a larger charging current when the heating circuit 114 is off, and controlling the charging circuit 116 to provide a smaller charging current when the heating circuit 114 is on. In one embodiment, the processing circuit 106 controls the charging circuit 116 to decrease the charging current when the processing circuit 106 determines the chime device 20 as analog and the heating circuit 114 is turned on.

Figure 8:
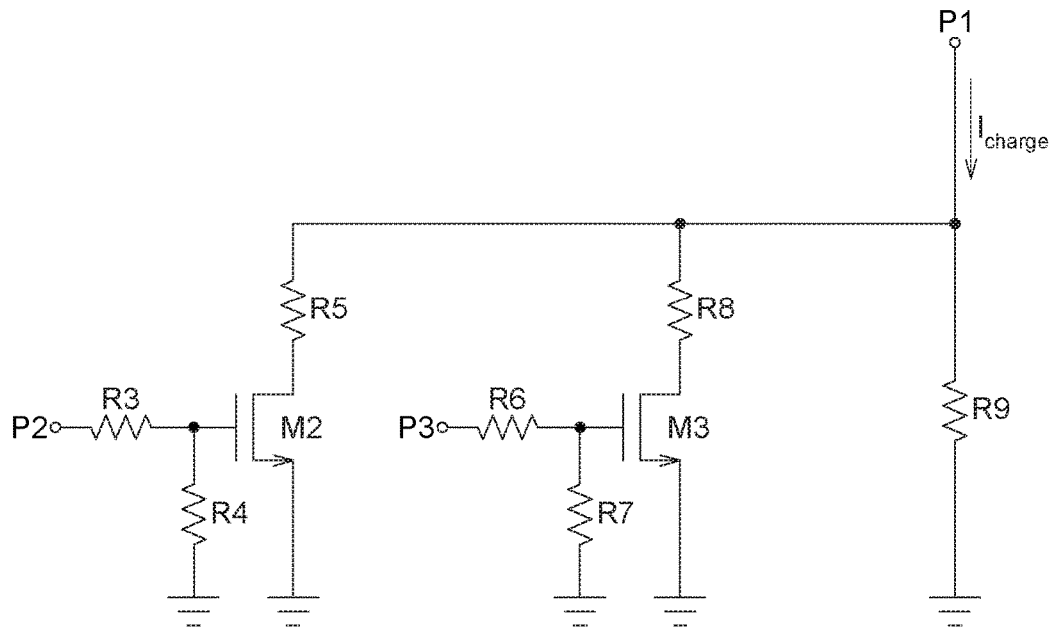
FIG. 8 shows part of a charging circuit according to an embodiment of the invention.

There may be several embodiments to implement the charging circuit 116 capable of adjusting the charging current. FIG. 8 shows part of a charging circuit according to an embodiment of the invention. The circuit shown in FIG. 8 is a part of the charging circuit 116, including resistors R3-R9 and NMOS transistors M2 and M3. The pins P1 and P2 receive control signals from the processing circuit 106. The pin p3 is coupled to other parts of the charging circuit 116. The processing circuit 106 controls the conducting state of the NMOS transistors M2 and M3. When the NMOS transistors M2 and M3 are off, the resistance between the pin P1 and ground is R9, generating a smaller charging current $I_{Charge}$. When the processing circuit 106 controls one NMOS transistor M3 to be turned on, the resistance between the pin P1 and ground is approximately R9 and R8 connected in parallel, generating a larger charging current $I_{Charge}$ because the resistance decreases. When the processing circuit 106 controls the NMOS transistors M3 and M2 to be both turned on, the resistance between the pin P1 and ground is approximately R9, R8, and R5 connected in parallel, generating a maximum charging current $I_{Charge}$ because the resistance further decreases.

The embodiments in FIG. 5 and FIG. 7 do not show the rectifier circuit 108. However, in one embodiment, the doorbell device in FIG. 5 and FIG. 7 may also include the rectifier circuit 108, coupled between the first power input terminal V1 and the second power input terminal V2, as shown in FIG. 3. Taking FIG. 7 as an example, based on the rectified voltage VR provided by the rectifier circuit 108, the processing circuit 106 may confirm whether the power is normally supplied and whether the voltage provided by the transformer 30 is sufficiently high. When the processing circuit 106 confirms that the rectified voltage VR is sufficiently large, representing that the transformer 30 is able to provide enough energy to the doorbell device 10, the processing circuit 106 then decides to turn on the heating circuit 114 when the temperature is low.

Figure 11:
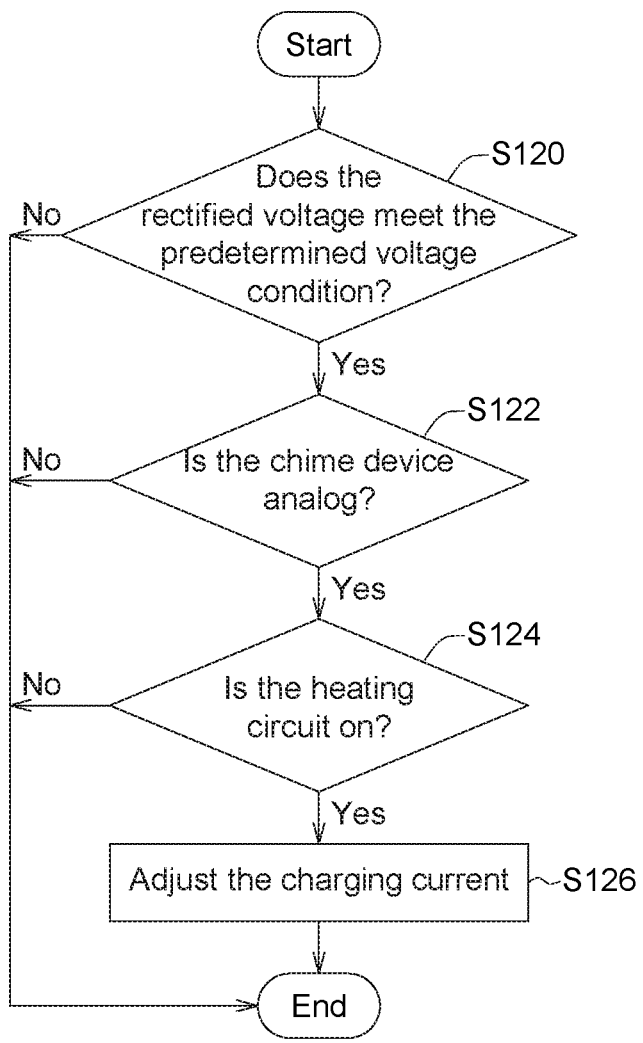
FIG. 11 shows a determination flowchart of adjusting the charging current according to an embodiment of the invention.

FIG. 11 shows a determination flowchart of adjusting the charging current according to an embodiment of the invention. The determination flowchart includes the following steps and may be performed by the processing circuit 106. Step S120: Determine whether the rectified voltage $V_R$ meets the predetermined voltage condition. The predetermined voltage condition is for example being greater than 16V. The step S120 not only confirms whether the power is normally supplied at this moment, but also confirms whether the energy provided by the power supply is sufficient to turn on the heating circuit 114. If the determination result of the step S120 is yes, proceed to step S122: determine whether the chime device 20 is analog. The determination in the step S122 may adopt the control method in FIG. 9 or FIG. 10, which is not repeated here. If the determination result of the step S122 is yes, proceed to step S124: determine whether the heating circuit 114 is on. For example, the heating circuit 114 is on when the sensed temperature $T_S$ is lower than the first threshold temperature T1, and the heating circuit 114 is off when the sensed temperature $T_S$ is higher than the second threshold temperature T2. During the period that the heating circuit 114 is on, step S126 may be executed to adjust the charging current, such as decreasing the charging current to prevent the malfunction of the doorbell device 10. The method for adjusting the charging current in the step S126 may be referred to the example shown in FIG. 8. Moreover, the heating circuit 114 may include multiple BJTs to provide different level of heating intensity. The processing circuit 106 may adjust different level of charging current according to the current heating intensity. The example shown in FIG. 8 is able to provide different level of charging current.

According to the doorbell device and the control method for the doorbell device presented in the embodiments given above, the type of the chime device can be determined automatically to simplify the installation process, preventing the malfunction of the device. In addition, by identifying the type of the chime device, the determination regarding whether to turn on the heating circuit can be made, and the charging current can be controlled correspondingly, so that the doorbell device can be adapted to the cold weather and maintain the normal operation.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A doorbell device, having a first power input terminal and a second power input terminal, the doorbell device coupled to a chime device, the doorbell device comprising:
   a current sensing circuit coupled to the first power input terminal, for generating a sensing voltage according to a current flowing through the current sensing circuit;
   a switch circuit coupled between the current sensing circuit and the second power input terminal, wherein the switch circuit changes a conducting state in response to a control signal;

a processing circuit, configured to provide the control signal and determine a type of the chime device according to the sensing voltage;

a heating circuit;

a temperature sensing circuit, configured to control the heating circuit according to a sensed temperature, turn on the heating circuit when the processing circuit determines the chime device as analog and the sensed temperature is lower than a first threshold temperature, and turn off the heating circuit when the sensed temperature is higher than a second threshold temperature;

a battery; and a charging circuit, configured to be controlled by the processing circuit to provide a charging current to the battery, and controlled by the processing circuit to decrease the charging current when the processing circuit determines the chime device as analog and the heating circuit is turned on.

2. The doorbell device according to claim 1, wherein the processing circuit determines the chime device as digital when the sensing voltage is less than a threshold value, and the processing circuit determines the chime device as analog when the sensing voltage is greater than the threshold value.

3. The doorbell device according to claim 2, wherein the doorbell device further comprises a rectifier circuit coupled between the first power input terminal and the second power input terminal, the rectifier circuit provides a rectified voltage to the processing circuit, the processing circuit enables the control signal to control the switch circuit to be turned on when the processing circuit determines that the rectified voltage meets a predetermined voltage condition, and the processing circuit sets the threshold value according to the rectified voltage.

4. A control method for a doorbell device, the doorbell device coupled to a chime device, the doorbell device comprising a switch circuit, a current sensing circuit, a heating circuit, a charging circuit and a battery, the control method comprising:

providing a control signal to control a conducting state of the switch circuit, wherein the switch circuit is coupled to the current sensing circuit, and the current sensing circuit generates a sensing voltage according to a current flowing through the current sensing circuit;

determining a type of the chime device according to the sensing voltage;

obtaining a sensed temperature;

controlling the heating circuit according to the sensed temperature;

turning on the heating circuit when the chime device is determined as analog and the sensed temperature is lower than a first threshold temperature;

turning off the heating circuit when the sensed temperature is higher than a second threshold temperature; and adjusting a charging current provided by the charging circuit to the battery, wherein the step of adjusting the charging current comprises controlling the charging circuit to decrease the charging current when the chime device is determined as analog and the heating circuit is turned on.

5. The control method according to claim 4, wherein the chime device is determined as digital when the sensing voltage is less than a threshold value, and the chime device is determined as analog when the sensing voltage is greater than the threshold value.

6. The control method according to claim 5, wherein the doorbell device further comprises a rectifier circuit coupled between the first power input terminal and the second power input terminal, the rectifier circuit provides a rectified voltage, the control method further comprising:

enabling the control signal to control the switch circuit to be turned on when the rectified voltage meets a predetermined voltage condition; and setting the threshold value according to the rectified voltage.

* * * * *